United States Patent
Chen

[11] Patent Number: 6,137,301
[45] Date of Patent: Oct. 24, 2000

[54] EPROM USED AS A VOLTAGE MONITOR FOR SEMICONDUCTOR BURN-IN

[75] Inventor: Chung-Zen Chen, Hsin-Chu, Taiwan

[73] Assignee: Vanguard International Semiconductor Company, Hsin-Chu, Taiwan

[21] Appl. No.: 09/075,745

[22] Filed: May 11, 1998

[51] Int. Cl.[7] .................................................. G01R 31/02
[52] U.S. Cl. ............................................................ 324/760
[58] Field of Search ................................ 324/158.1, 73.1, 324/760, 765; 438/14, 17, 18; 257/40, 48; 714/733

[56] References Cited

U.S. PATENT DOCUMENTS

| | | | |
|---|---|---|---|
| 4,799,021 | 1/1989 | Cozzi | 324/73.1 |
| 4,900,948 | 2/1990 | Hamilton | 324/73.1 |
| 5,452,253 | 9/1995 | Choi | 365/201 |
| 5,561,639 | 10/1996 | Lee et al. | 365/230.06 |
| 5,656,944 | 8/1997 | Choi | 324/763 |
| 5,923,098 | 7/1999 | Olson | 324/500 |

*Primary Examiner*—Vinh P. Nguyen
*Attorney, Agent, or Firm*—George O. Saile; Stephen B. Ackerman

[57] ABSTRACT

In the present invention is described the use of an EPROM that is configred in a special way to monitor in situ the applied voltage to semiconductor product in a bun-in test and capture the maximum value of the applied voltage during the test. This technique operates off the threshold shift mechanism in which gate bias induces electrons at the substrate surface which are accelerated by the drain and trapped in the polysilcon gate after the electrons overcome the gate oxide energy barrier. This puts an extra bias on the gate making a threshold voltage shift. The measurement of the threshold voltage shift for a particular period of time will be proportional to the value of the applied voltage. The trapped electrons can be released back to the substrate by use of ultra violet light since the electrons gain energy from the UV light to overcome the gate oxide energy barrier.

4 Claims, 3 Drawing Sheets

EPROM USED AS A VOLTAGE MONITOR FOR SEMICONDUCTOR BURN-IN

BACKGROUND OF THE INVENTION

1. Field of Invention

This invention applies to semiconductor testing and in particular to burn-in testing and the monitoring of product bias during burn-in.

2. Description of Related Art

Burn-in testing is an important means by which infant mortality and early life failures can be culled out from a semiconductor product line. At the same time it is important that the product be tested under bias stress during burn-in. The stress testing should not be to much leading to unnecessary failures or too little and not finding enough failing parts to assure an outgoing product quality level.

The applied bias to the semiconductor parts during burn-in provides the necessary electrical stress and is usually at a voltage higher than for normal operations. Shifts in this voltage, commonly called "noise", provides a source of the product being over stressed or under stressed during test. This potential for bias voltage variation as seen by the product under test gives rise to the need for a means to monitor the applied voltage.

In U.S. Pat. No. 5,452,253 (Choi) an internal voltage generator provides a regulated bias for a semiconductor memory array. When a burn-in stress voltage is detected, the internal voltage generator provides an voltage stress to the semiconductor array. The burn-in test mode is activated if particular signal conditions are met and the external voltage is higher than a pre-set burn-in test voltage. This prevents the test device from entering test mode due to noise on the external power supply.

In U.S. Pat. No. 5,561,639 (Lee et al.) a burn-in test signal generator detects whether the applied voltage bias to a semiconductor memory chip is normal or at a burn-in level. When a burn-in level voltage is detected, test time can be reduced by selecting a plural of memory cell rows in accordance with any address applied during burn-in and different from normal operations.

In U.S. Pat. No. 5,656,944 (Choi) a burn-in detection circuit detects whether an external applied voltage is above a predetermined voltage level for burn-in testing and having a hysteresis effect in which coming out of burn-in test is not allowed until the applied external voltage further increases before decreasing. This in turn prevents noise on the external voltage from taking the test device out of burn-in.

Whereas, the above references concentrate on providing a burn-in bias and attempting to avoid noise on the applied external voltage bias, it is important to know what the external voltage bias is throughout the burn-in test. Determining that the voltage bias that is stressing the product is too high could indicate that there were parts that failed which should have passed the test. At the same time an under voltage provides an under stress of the product and could provide tested parts that have too high a failure rate.

SUMMARY OF THE INVENTION

It is an objective of the present invention to provide a means for tracking and measuring the bias voltage in situ during burn-in to determine whether the voltage stress of the product under test was within defined limits during test. To accomplish this an EPROM, particularly configured, is connected to the voltage bias on the test board and monitors the bias applied to the product during burn-in.

The use of the EPROM with a P-type substrate to measure the applied voltage works on the threshold voltage shift mechanism. The gates of the EPROM induce electrons at the substrate surface and the drain will accelerate the electron energy. Once these electrons exceed the gate oxide energy barrier, they become trapped into the polysilicon gate. This in turn shifts the gate threshold voltage. Over time for a particular voltage the threshold voltage will continue to increase. Upon calibrating the change in threshold voltage versus time for a particular voltage source, the change in threshold voltage for an amount of elapsed time provides a measure of the applied voltage. This change in threshold voltage can be measure at any time during or after the test. The threshold voltage can be erased and returned to normal by applying ultra violet light to the EPROM. An EEPROM or other similarly constructed device could also be used to make the in situ voltage measurement in a similar way.

A burn-in test configuration called "board isolation" is connected with one hundred to two hundred semiconductor devices on the board with all signal pins of each device with the same pin assignment connected together and in turn connected to a driver board through a resistor. A voltage bias is connected to each semiconductor device and to an EPROM configured to monitor the voltage bias and record the maximum voltage occurrence during the burn-in test. A second burn-in test configuration known as "row isolation" is configured such that signal pins with the same pin assignment for the semiconductor devices in a row on the test board are connected together, and each row of signal pins is connected to the driver board through a separate resistor. A voltage bias is connected to each row of semi-conductors devices and to an EPROM configured to monitor the voltage bias during burn-in and record the maximum voltage occurrence.

A third burn-in test configuration known as "socket isolation" is configured such that each signal pin of each semiconductor device is connected together and further connected to a driver board through a resistor. A voltage bias is connected separately to each semiconductor device, and an EPROM is connected to each voltage bias to monitor the voltage bias during burn-in and record the maximum voltage occurrence.

The voltage bias to which the EPROM's are connected induce a gate threshold voltage that is proportional to the voltage bias. As the voltage bias fluctuates to be larger than the previous voltage bias value the gate threshold voltage increases. When the voltage bias fluctuates to be less than the previous voltage bias value the gate threshold voltage remains unchanged.

The reading of the EPROM gate threshold voltage can be done after testing is complete or during the burn-in test. The threshold voltage measurement can be done during burn-in once a relay is switched from test mode to measurement mode. In test mode the relay connects the drain and the gate of the EPROM together and to $V_{DD}$. During test mode the relay connects the gate and drain separately to a test system measurement unit so that the threshold voltage can be measured. The EPROM can be erased by using ultra violet light which will recover the threshold voltage to an initial value.

BRIEF DESCRIPTION OF THE DRAWINGS

This invention will be described with reference to the accompanying drawings, wherein.

DETAILED DESCRIPTION OF THE PREFERRED EMBODIMENT

Figure 1A:
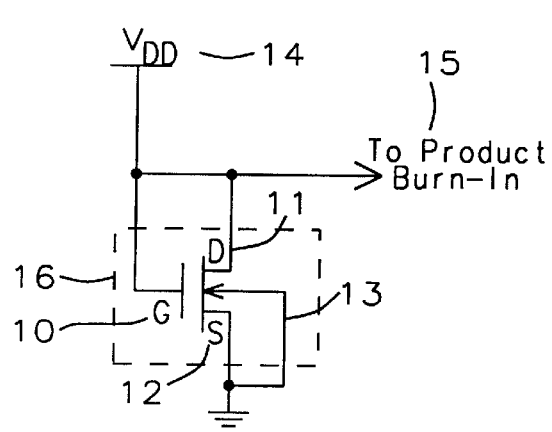
FIG. 1a shows the EPROM transistor connections used to measure burn-in bias voltage.

In FIG. 1a is shown connections of an EPROM transistor 16 configured to monitor a voltage and record the maximum occurrence of that voltage. The gate 10 is connected to the drain 11 of the transistor of the EPROM and is further connected to voltage bias $V_{DD}$ 14 and to the product in burn-in test 15. The source 12 and the P substrate 13 of the transistor are connected to circuit ground. The gate 10 connected to the bias voltage 14 induces electrons at the substrate surface 13 and the drain 11 accelerates the electron energy. Once the electrons exceed the gate oxide energy barrier, the electrons are trapped into the polysilicon gate which shifts the gate threshold voltage. If the bias voltage $V_{DD}$ 14 increases over time, additional electrons will be induced into the polysilicon and the transistor threshold voltage will increase. If the bias voltage $V_{DD}$ 14 decreases over time no change in the induced charge and the threshold voltage will occur. Charge is remove from the polysilicon gate 10 by means of ultra violet light.

Figure 1B:
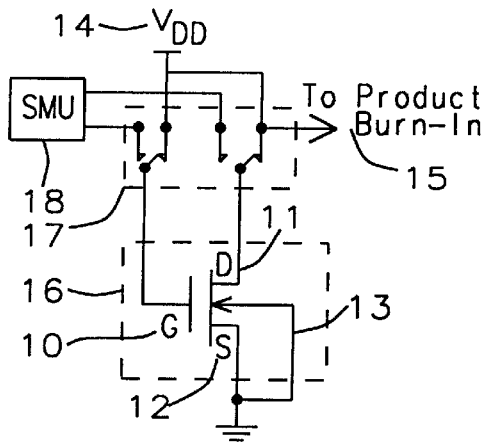
FIG. 1b shows the EPROM transistor connections to provide for threshold voltage measurement.

In FIG. 1b is shown a system measurement unit SMU 18 connected to the EPROM transistor 16 through a relay 17. The relay 17 allows the EPROM 16 to be connected to the product burn-in and allows the threshold voltage of the EPROM transistor 16 to be measured during and after the burn-in test. To measure the EPROM transistor 16 threshold voltage, the relay 17 disconnects the gate 10 from the drain 11 and from the burn-in product 15 and connects the gate 10 and the drain 11 to the SMU 18. To monitor the burn-in bias voltage $V_{DD}$ 14, the relay disconnects the gate 10 and the drain 11 from the SMU 18, and connects the gate 10 to the drain 11 and $V_{DD}$ 14, and to the product in burn-in 15.

Figure 2:
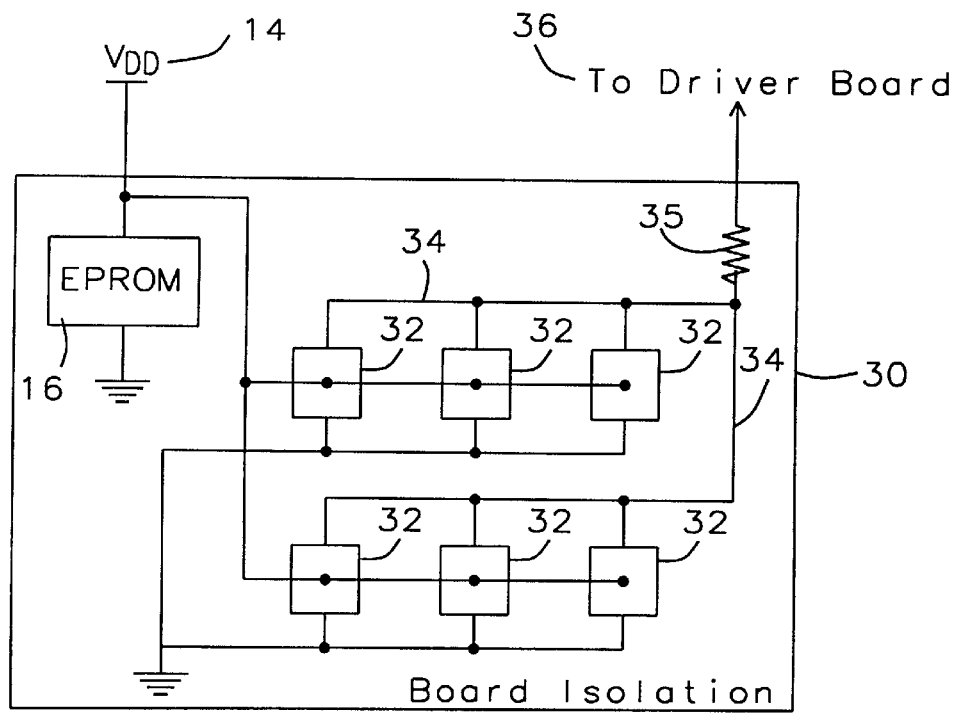
FIG. 2 is the burn-in test configuration for board isolation.

Referring to FIG. 2, a burn-in test board 30 is shown and is configured to provide board isolation during burn-in testing. A voltage bias $V_{DD}$ 14 is connected to all semiconductor product 32 that are contained on the board 30 and all semiconductor product is further connected to ground. An EPROM 16 configured to monitor and record the maximum value of a voltage is connected to the voltage bias $V_{DD}$ 14. Not shown for simplicity is the relay 17 and the SMU 18, shown in FIG. 1b. All the signal pins 34 of all of the semiconductor product 32 are connected together and then to a resistor 35 which is further connected to a driver board 36 of the burn-in system. A charge will build up in the EPROM 16 proportional to the voltage bias $V_{DD}$ 14 which will increase the gate threshold voltage. Later during burn-in if the voltage bias $V_{DD}$ 14 varies to be of larger value, the EPROM 16 will build up an additional charge proportional to the larger value of the voltage bias $V_{DD}$ 14 and further increasing threshold voltage. If the voltage bias $V_{DD}$ 14 varies to be of smaller value, the charge build up of the EPROM 16 will not change and the threshold voltage will remain the same. The gate threshold voltage of the EPROM 16 can be measured during burn-in test or after the test is completed since the charge is held in the polysilicon gate until erased by an ultra violet light.

Figure 3:
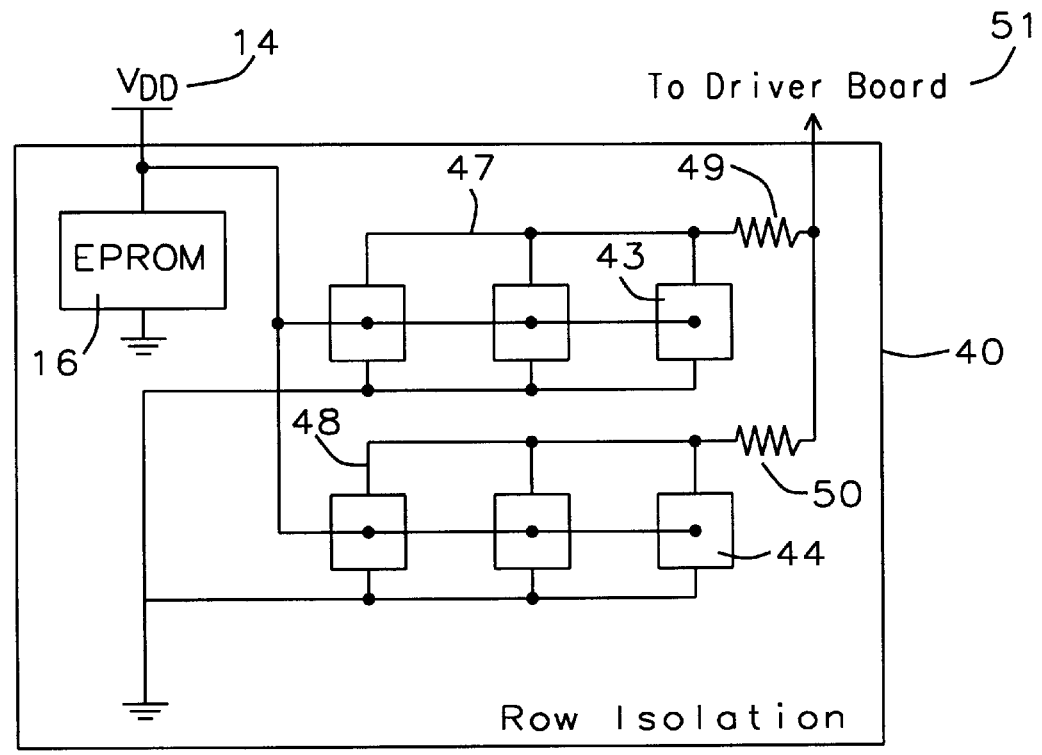
FIG. 3 is the burn-in test configuration for row isolation.

In FIG. 3 a burn-in test board 40 is shown and is configured to provide row isolation during burn-in testing. A voltage bias $V_{DD}$ 14 is connected to all semiconductor product that are contained on the board 40, and the semiconductor product is further connected to circuit ground. An EPROM 16 configured to monitor and record the maximum value of a voltage is connected to the voltage bias $V_{DD}$ 14. Not shown from simplicity is the relay 17 and the SMU 18, shown in FIG. 1b. All the signal pins 47 with the same pin assignment of all of the semiconductor product in a row 43 are connected together and then to a resistor 49 which is further connected to a driver board 51 of the burn-in system. All the signal pins 48 with the same pin assignment of all of the semiconductor product in an additional row 44 are connected together and then to a resistor 50 which is further connected to a driver board 51 of the burn-in system.

Continuing to refer to FIG. 3, a charge will build up in the EPROM 16 proportional to the voltage bias $V_{DD}$ 14 which will increase the gate threshold voltage. Later during burn-in, if the voltage bias $V_{DD}$ 14 varies to be of larger value, the EPROM 16 will build up an additional charge proportional to the larger value of the voltage bias $V_{DD}$ 14, and further increasing threshold voltage. If the voltage bias $V_{DD}$ 14 varies to be of smaller value, the charge build up of the EPROM 16 will not change and the threshold voltage will remain the same. The gate threshold voltage of the EPROM 16 can be measured during burn-in test or after the test is completed since the charge is held in the polysilicon gate until erased by an ultra violet light.

Figure 4:
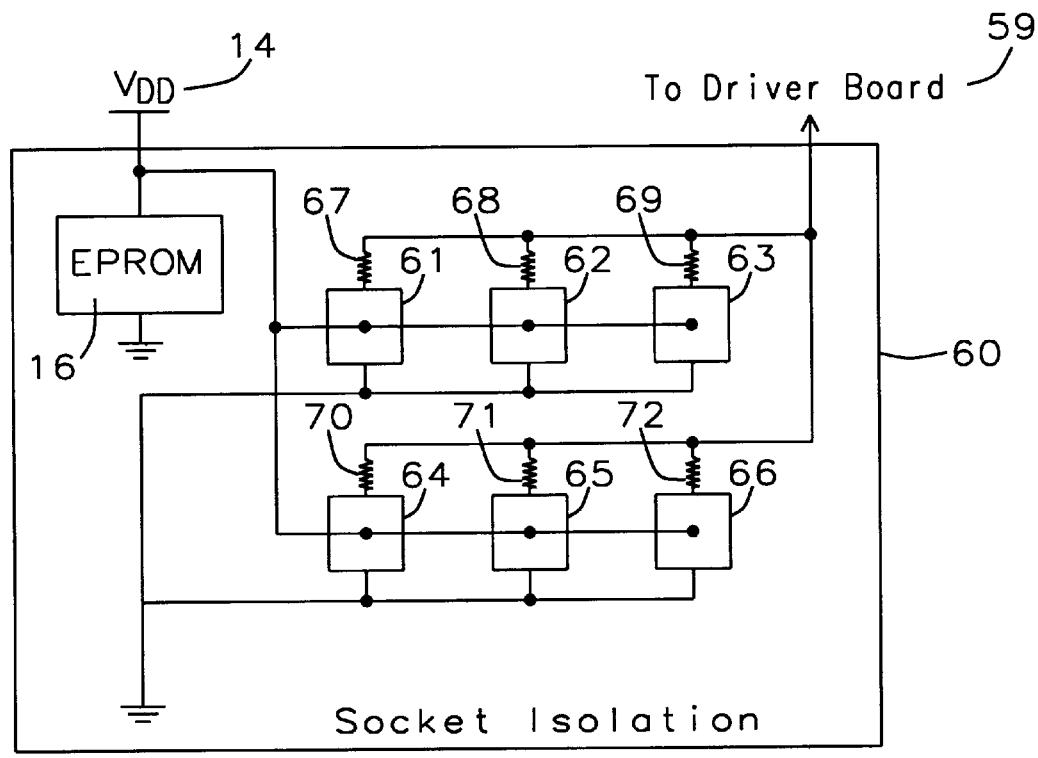
FIG. 4 is the burn-in test configuration for socket isolation.

In FIG. 4 a burn-in test board 60 is shown and is configured to provide socket isolation during burn-in testing. Each individual socket 61, 62, 63, 64, 65, and 66 holding a semiconductor product under test is isolated from each other and the test system driver board 59 by resistors 67, 68, 69, 70, 71, and 72 where all the signal pins of each socket are connected to the corresponding isolation resistors 67, 68, 69, 70, 71, and 72. Each individual socket 61, 62, 63, 64, 65, and 66 is powered from a voltage bias $V_{DD}$ 14 to which is connected an EPROM 16 configured to measure the maximum bias voltage, and all semiconductor product is further connected to ground. Not shown for simplicity is the relay 17 and the SMU 18, shown in FIG. 1b.

Continuing to refer to FIG. 4, a charge will build up in the EPROM 16 proportional to the voltage bias $V_{DD}$ 14 which will increase the gate threshold voltage. Later during burn-in, if the voltage bias 14 varies to be of larger value, the EPROM 16 will build up an additional charge proportional to the larger value of the voltage bias $V_{DD}$ 14 and further increasing threshold voltage. If the voltage bias $V_{DD}$ 14 varies to be of smaller value, the charge build up of the EPROM 16 will not change and the threshold voltage will remain the same. The gate threshold voltage of the EPROM 16 can be measured during burn-in test or after the test is completed since the charge is held in a polysilicon gate until erased by an ultra violet light.

Figure 5:
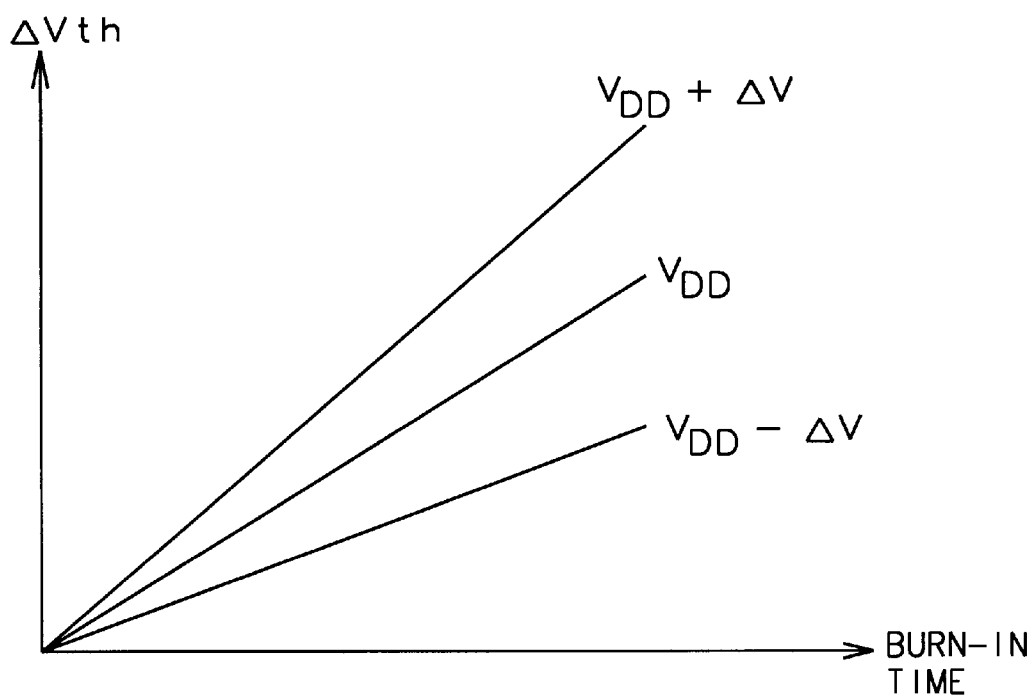
FIG. 5 is a diagram showing threshold voltage of the EPROM as a function of burn-in time and bias voltage.

In FIG. 5 is shown a graph of the change in threshold voltage, $\Delta V$th versus burn-in time as a function of the bias voltage $V_{DD}$ and variations about the mean. As can be seen from this graph the change in threshold voltage, Vth, of the EPROM gate continues to increase with burn-in time for a constant value of $V_{DD}$. As $V_{DD}$ changes to a higher value during burn-in test the change in threshold voltage of the EPROM, $\Delta V$th, increases. If the value of $V_{DD}$ decreases during test there will be no change in $\Delta V$th because the trapped charge in the polysilicon can only be removed by ultraviolet light, making the EPROM only a maximum voltage monitor. Since the value of the threshold voltage is time dependent, the amount of time that the burn-in test is run is important in translating the change in Vth to a value for $V_{DD}$.

While the invention has been particularly shown and described with reference to preferred embodiments thereof, it will be understood by those skilled in the art that various changes in form and details may be made without departing from the spirit and scope of the invention.

What is claimed is:

1. A voltage monitor for semiconductor burn in, comprising:
   a) a burn-in board populated with semiconductor product;
   b) said semiconductor product connected to a voltage bias;
   c) signal pins of said semiconductor product connected together and connected to a first terminal of a resistor in which a second terminal of said resistor is connected to a driver board,
   d) a specially configured EPROM connected to said voltage bias to continuously monitor said voltage bias during burn-in test of said semiconductor product,
   e) said EPROM capturing and holding a maximum voltage occurrence of said voltage bias during product burn-in.

2. The voltage monitor of claim 1, wherein the EPROM is configured with source and substrate of said EPROM connected to ground and gate and drain of said EPROM connected to said voltage bias.

3. The voltage monitor of claim 1, wherein the EPROM can be read out during and after said burn-in test of said semiconductor product.

4. The voltage monitor of claim 1, wherein said EPROM monitors said voltage bias which is distributed to all semiconductor product on said burn-in board and where all signal pins of said semiconductor product are connected to said first terminal of said resistor in which said second terminal of said resistor is further connected to said driver board.

* * * * *